United States Patent
Li et al.

(10) Patent No.: US 11,552,028 B2
(45) Date of Patent: Jan. 10, 2023

(54) CHIP PACKAGING METHOD AND CHIP PACKAGING STRUCTURE

(71) Applicant: HUZHOU JIANWENLU TECHNOLOGY CO., LTD., Huzhou (CN)

(72) Inventors: Linping Li, Hangzhou (CN); Jinghao Sheng, Hangzhou (CN); Zhou Jiang, Hangzhou (CN)

(73) Assignee: HUZHOU JIANWENLU TECHNOLOGY CO., LTD., Huzhou (CN)

( * ) Notice: Subject to any disclaimer, the term of this patent is extended or adjusted under 35 U.S.C. 154(b) by 0 days.

(21) Appl. No.: 17/598,270

(22) PCT Filed: Sep. 25, 2020

(86) PCT No.: PCT/CN2020/117655
§ 371 (c)(1),
(2) Date: Sep. 26, 2021

(87) PCT Pub. No.: WO2021/073401
PCT Pub. Date: Apr. 22, 2021

(65) Prior Publication Data
US 2022/0181269 A1 Jun. 9, 2022

(30) Foreign Application Priority Data
Oct. 15, 2019 (CN) .......... 201910978107.6

(51) Int. Cl.
*H01L 23/495* (2006.01)
*H01L 23/552* (2006.01)
(Continued)

(52) U.S. Cl.
CPC .......... *H01L 23/552* (2013.01); *H01L 21/486* (2013.01); *H01L 21/4853* (2013.01);
(Continued)

(58) Field of Classification Search
CPC combination set(s) only.
See application file for complete search history.

(56) References Cited

U.S. PATENT DOCUMENTS 6,180,426 B1 * 1/2001 Lin .................... G01R 31/2884
257/E21.705
9,478,599 B1  10/2016 Gubser et al.
(Continued)

FOREIGN PATENT DOCUMENTS

CN    101134557 A    3/2008
CN    104140072 A    11/2014
(Continued)

OTHER PUBLICATIONS

European Patent Office, Extended European Search Report Issued in Application No. 20876619.6, dated May 6, 2022, Germany, 7 pages.

*Primary Examiner* — Niki H Nguyen
(74) *Attorney, Agent, or Firm* — Kilpatrick Townsend & Stockton, LLP

(57) ABSTRACT

A method for packaging a chip and a chip packaging structure. A passivation layer is provided on bonding pads of a wafer, a first metal bonding layer is formed on the passivation layer, and a second metal bonding layer is formed on a substrate. The substrate and the wafer are bonded via the first metal bonding layer and the second metal bonding layer, and are packaged as a whole. A first shielding layer is provided on the substrate, and the first shielding layer is in contact with the second metal bonding layer. After the wafer and the substrate are bonded, the wafer is subject to half-cutting to expose the first metal bonding layer. Then, the second shielding layer electrically connected to the first metal bonding layer is formed.

20 Claims, 9 Drawing Sheets

(51) Int. Cl.
*H01L 21/48* (2006.01)
*H01L 21/78* (2006.01)
*H01L 23/498* (2006.01)
*H01L 23/00* (2006.01)

(52) U.S. Cl.
CPC ........ *H01L 21/78* (2013.01); *H01L 23/49816* (2013.01); *H01L 23/49827* (2013.01); *H01L 24/03* (2013.01); *H01L 24/08* (2013.01); *H01L 24/80* (2013.01); *H01L 2224/033* (2013.01); *H01L 2224/03011* (2013.01); *H01L 2224/0384* (2013.01); *H01L 2224/08225* (2013.01); *H01L 2224/80895* (2013.01)

(56) References Cited

U.S. PATENT DOCUMENTS

| | | | |
|---|---|---|---|
| 10,840,190 B1* | 11/2020 | Yang | H01L 21/76805 |
| 11,387,204 B2* | 7/2022 | Chen | H01L 23/528 |
| 2003/0218257 A1 | 11/2003 | Ishio et al. | |
| 2004/0087043 A1* | 5/2004 | Lee | B81C 1/00269 |
| | | | 257/E23.181 |
| 2004/0166662 A1 | 8/2004 | Lei | |
| 2005/0167795 A1 | 8/2005 | Higashi | |
| 2006/0216857 A1 | 9/2006 | Zhao | |
| 2009/0321863 A1 | 12/2009 | Borthakur et al. | |
| 2010/0252898 A1 | 10/2010 | Tanaka et al. | |
| 2011/0074026 A1* | 3/2011 | Shim | H01L 21/50 |
| | | | 257/737 |
| 2014/0332909 A1* | 11/2014 | Li | B81C 1/00238 |
| | | | 438/51 |
| 2014/0353810 A1 | 12/2014 | Sugimoto et al. | |
| 2015/0099357 A1 | 4/2015 | Shiu et al. | |
| 2017/0077049 A1 | 3/2017 | Yuasa et al. | |
| 2017/0077158 A1 | 3/2017 | Huang et al. | |
| 2017/0186726 A1 | 6/2017 | Tang et al. | |
| 2018/0277517 A1* | 9/2018 | Kim | H01L 25/0657 |
| 2019/0304927 A1 | 10/2019 | Kim et al. | |
| 2020/0105600 A1* | 4/2020 | Lu | H01L 24/83 |
| 2020/0328181 A1* | 10/2020 | Liu | H01L 25/18 |

FOREIGN PATENT DOCUMENTS

| | | |
|---|---|---|
| CN | 105428325 A | 3/2016 |
| CN | 106531641 A | 3/2017 |
| CN | 106992160 A | 7/2017 |
| CN | 110676244 A | 1/2020 |
| CN | 110010480 A | 9/2021 |
| JP | 2004209585 A | 7/2004 |
| JP | 2019175981 A | 10/2019 |
| WO | 2015145623 A1 | 10/2015 |

* cited by examiner

CHIP PACKAGING METHOD AND CHIP PACKAGING STRUCTURE

The present application is the national phase of International Application No. PCT/CN2020/117655, titled "CHIP PACKAGING METHOD AND CHIP PACKAGING STRUCTURE", filed on Sep. 25, 2020, which claims the priority to Chinese Patent Application No. 201910978107.6, titled "METHOD FOR PACKAGING CHIP AND CHIP PACKAGING STRUCTURE", filed on Oct. 15, 2019 with the China National Intellectual Property Administration, which is incorporated herein by reference in its entirety.

FIELD

The present disclosure relates to the field of semiconductor device manufacturing, and in particular to a method for packaging a chip and a chip packaging structure that provide electromagnetic shielding.

BACKGROUND

In conventional technology, an electromagnetic shielding design that aims to reduce electromagnetic interference (EMI) mainly applies the wafer-level chip-scale package (WLCSP) in a following manner. An active or passive component arranged on a circuit board is wrapped by a plastic material through compression molding, and then is provided with a metal cover. In one embodiment, the integrally wrapped component is connected to the ground, so as to achieve the EMI protection. Such technique increases a thickness and a volume of the final product. The mere metal cover cannot provide an ideal anti-EMI effect, and there is still much interference.

SUMMARY

In view of the above, a method for packaging a chip and a chip packaging structure are provided according to embodiments of the present disclosure, so as to address an issue of an unsatisfactory effect of anti-electromagnetic-interference in wafer-level chip packaging in conventional technology.

A method for packaging a chip is provided, including:
providing a wafer, where the wafer includes a first surface and a second surface that are opposite to each other, at least two functional circuit regions and multiple bonding pads are formed on the first surface, and the multiple bonding pads are located around each of the at least two functional circuit regions;
forming a passivation layer on each of the multiple bonding pads, where the passivation layer includes a center region and a peripheral region surrounding the center region;
forming a first metal bonding layer on the passivation layer, where the first metal bonding layer covers the peripheral region of the passivation layer;
providing a substrate, where the substrate includes a third surface and a fourth surface that are opposite to each other, a second metal bonding layer and a first shielding layer are formed on the third surface, the second metal bonding layer is configured to be bonded with the first metal bonding layer, the first shielding layer is configured to face the at least two functional circuit regions after the wafer and the substrate are bonded, and the first shielding layer is in contact with the second metal bonding layer;
bonding the first metal bonding layer with the second metal bonding layer, where at least a part of the center region is not covered by the second metal bonding layer, and the third surface is attached to a surface of the passivation layer away from the wafer after the bonding;
performing half-cutting from the second surface of the wafer toward the substrate, to form a cutting groove exposing at least the first metal bonding layer; and
forming a second shielding layer on the second surface of the wafer and in the cutting groove, where the second shielding layer is electrically connected to the first metal bonding layer.

In a preferable embodiment, after bonding the first metal bonding layer with the second metal bonding layer and before performing the half-cutting from the second surface of the wafer towards the substrate, the method further includes:
thinning the substrate from the fourth surface;
etching the substrate and the center region of the passivation layer to form an opening, where the opening runs through at least the substrate and the passivation layer to expose one of the multiple bonding pads; and
filling the opening to form a conductive structure.

In a preferable embodiment, after performing the half-cutting from the second surface of the wafer towards the substrate, the method further includes:
thinning the substrate from the fourth surface;
etching the substrate and the center region of the passivation layer to form an opening, where the opening runs through at least the substrate and the passivation layer to expose a bound pad of the multiple bonding pads; and
filling the opening to form a conductive structure.

In a preferable embodiment, etching the substrate and the center region to form the opening includes:
etching the thinned substrate, the second metal bonding layer, and the passivation layer sequentially, from a surface of the thinned substrate away from the third surface, to expose the bonding pad and form the opening.

In a preferable embodiment, after filling the opening to form the conductive structure, the method further includes:
placing a solder ball on a surface of the conductive structure.

In a preferable embodiment, forming the first metal bonding layer on the passivation layer includes:
forming a first groove on the passivation layer; and
filling the first groove through a Damascene process to form the first metal bonding layer, where a surface of the first metal bonding layer away from the passivation layer is flush with a surface of the passivation layer away from the multiple bonding pads.

In a preferable embodiment, after forming the first metal bonding layer, the method further includes:
planarizing the surface of the first metal bonding layer and the surface of the passivation layer, where the surface of the first metal bonding layer is flush with the surface of the passivation layer after the planarizing.

In a preferable embodiment, providing the substrate includes:
providing a base of the substrate, wherein the base of the substrate includes the third surface and the fourth surface that are opposite to each other;
forming a second groove on the third surface;
filling the second groove through a Damascene process to form the second metal bonding layer, where a surface of the second metal bonding layer away from the substrate is flush with the third surface; and
forming the first shielding layer that is in contact with the second metal bonding layer, where the first shielding layer corresponds to the at least two functional circuit regions after the wafer and the substrate are bonded.

In a preferable embodiment, after forming the second metal bonding layer, the method further includes:

planarizing the surface of the second metal bonding layer and a surface of the base of the substrate, where the surface of the second metal bonding layer is flush with the surface of the base of the substrate after the planarizing.

In a preferable embodiment, before forming the first shielding layer, the method further includes:

forming a third groove on the third surface, where the third groove is located at a position facing the at least two functional circuit regions after bonding the wafer and the substrate.

In a preferable embodiment, a material of the first shielding layer is metallic, and is same as a material of the second shielding layer.

In a preferable embodiment, a material of the first metal bonding layer is metallic, and is same as a material of the second metal bonding layer.

A chip packaging structure manufactured through any foregoing method is further provided according to embodiments of the present disclosure. The chip includes:

a wafer and a substrate that are opposite to each other;

a functional circuit region and a bonding pad that are located on a surface of the wafer facing the substrate, where the bonding pad is located around the functional circuit region;

a passivation layer, located on the bonding pad and attached to a surface of the substrate;

a first metal bonding layer located on a surface of the passivation layer away from the wafer;

a second metal bonding layer located on a surface of the substrate facing the wafer, where a bonding interface is formed between the first metal bonding layer and the second metal bonding layer;

a conductive structure located in the substrate, where the conductive structure runs through at least the substrate and the passivation layer, and is electrically connected to the bonding pad;

a first shielding layer, covering a surface of the substrate facing the wafer, where the first shielding layer is electrically connected to the second metal bonding layer; and a second shielding layer, covering surfaces of the wafer other than the surface facing the substrate, and covering a sidewall of the passivation layer.

In a preferable embodiment, the chip packaging structure further includes a solder ball located on the conductive structure.

In a preferable embodiment, a material of the first shielding layer is metallic, and is same as a material of the second shielding layer.

In a preferable embodiment, the material of the first shielding layer includes copper, silver, nickel, or nickel-iron alloy.

In a preferable embodiment, a material of the first metal bonding layer is metallic, and is same as a material of the second metal bonding layer.

In a preferable embodiment, the material of the first metal bonding layer includes copper, gold, or copper-tin alloy.

In a preferable embodiment, a thickness of the first metal bonding layer ranges from 100 nm to 1000 nm, endpoints included.

In a preferable embodiment, a thickness of the passivation layer ranges from 1 μm to 5 μm, endpoints included.

In a preferable embodiment, a material of the passivation layer includes silicon, amorphous AlN, $Si_3N_4$, or silicon oxide.

In a preferable embodiment, a thickness of the second metal bonding layer ranges from 1 μm to 5 μm, endpoints included.

In a preferable embodiment, a thickness of the substrate ranges from 30 μm to 100 μm, endpoints included.

In a preferable embodiment, a groove is provided in a region on the surface of the substrate facing the wafer, where the region faces the functional circuit region.

In a preferable embodiment, the chip packaging structure is a chip including a filter, and the functional circuit region corresponding to the filter is a resonance circuit.

According to the embodiments of the present disclosure, in the method for packaging the chip, the passivation layer is provided on the bonding pads of the wafer, the first metal bonding layer is formed on the passivation layer, and the second metal bonding layer is formed on the substrate. The substrate and the wafer are bonded via the first metal bonding layer and the second metal bonding layer, and are packaged as a whole. The first shielding layer is provided on the substrate, and the first shielding layer is in contact with the second metal bonding layer. After the wafer and the substrate are bonded, the wafer is subject to half-cutting to expose the first metal bonding layer. Then, the second shielding layer electrically connected to the first metal bonding layer is formed. In one embodiment, formed is an electromagnetic shielding structure including the first shielding layer, the second metal bonding layer, the second shielding layer, and the first metal bonding layer. The shielding structure forms an approximately closed space, improving the electromagnetic shielding effect.

BRIEF DESCRIPTION OF THE DRAWINGS

Embodiments of the present disclosure, hereinafter briefly described are the drawings to be applied in embodiments of the present disclosure.

DETAILED DESCRIPTION OF EMBODIMENTS

Figure 1:
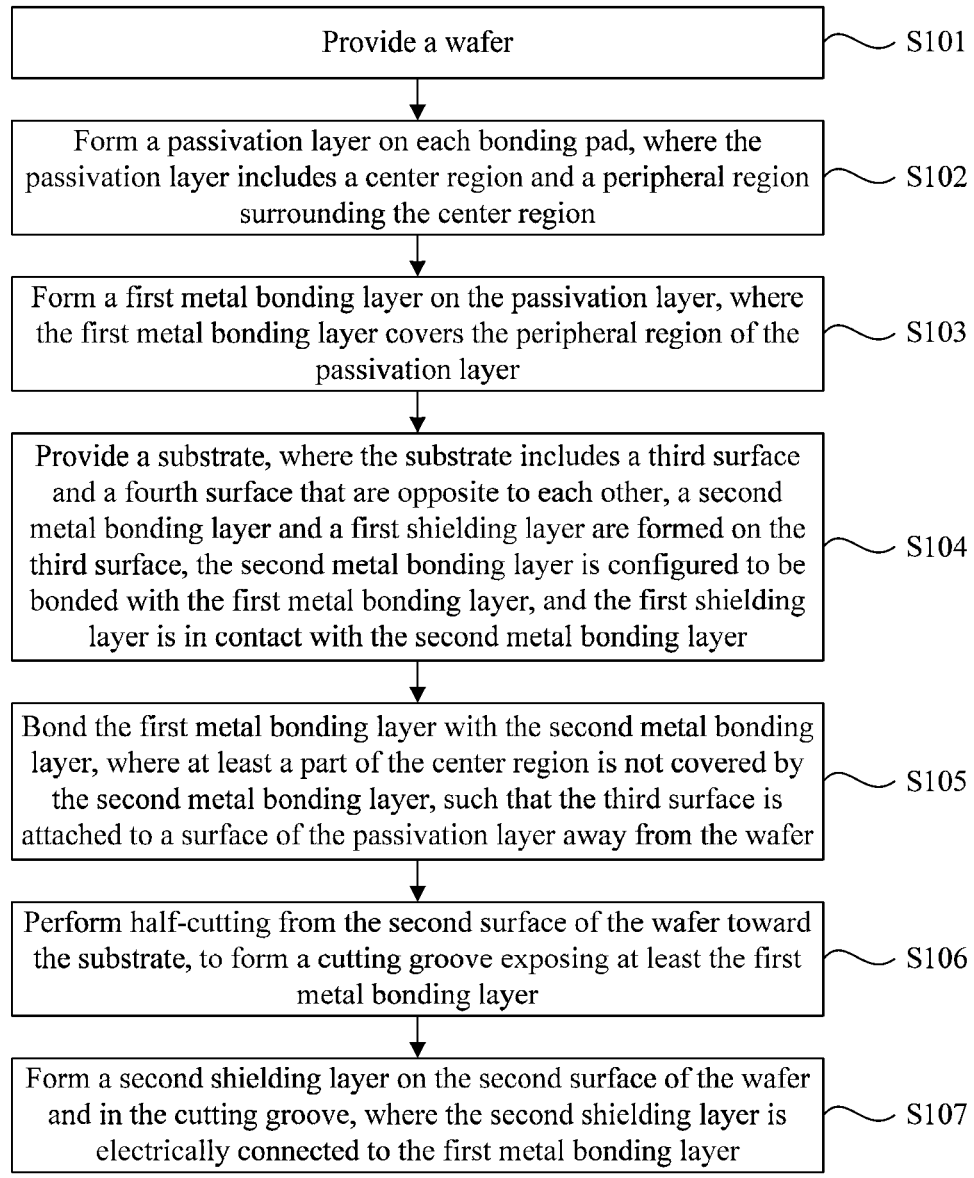
FIG. 1 is a flow chart of a method for packaging a chip according to an embodiment of the present disclosure.

As mentioned in the background, electromagnetic shielding achieved through providing a metal protective cover is not ideal in conventional technology.

It is found that the provided metal protective cover results in a bulky package of wafer-level chips. Moreover, the metal cover is generally applied to one side of a chip packaging structure, and hence such structure is not closed, resulting in a poor electromagnetic shielding effect.

Hence, a method for packaging a chip is provided according to embodiments of the present disclosure. The method includes following steps.

A wafer is provided. The wafer includes a first surface and a second surface that are opposite to each other. At least two functional circuit regions and multiple bonding pads are formed on the first surface, and the multiple bonding pads are located around each of the at least two functional circuit regions.

A passivation layer is formed on each of the multiple bonding pads. The passivation layer includes a center region and a peripheral region surrounding the center region.

A first metal bonding layer is formed on the passivation layer. The first metal bonding layer covers the peripheral region of the passivation layer.

A substrate is provided. The substrate includes a third surface and a fourth surface that are opposite to each other. A second metal bonding layer and a first shielding layer are formed on the third surface, the second metal bonding layer is configured to be bonded with the first metal bonding layer, the first shielding layer is configured to face the at least two functional circuit regions after the wafer and the substrate are bonded. The first shielding layer is in contact with the second metal bonding layer.

The first metal bonding layer is bonded with the second metal bonding layer. At least a part of the center region is not covered by the second metal bonding layer, and the third surface is attached to a surface of the passivation layer away from the wafer.

Half-cutting is performed from the second surface of the wafer towards the substrate, to form a cutting groove exposing at least the first metal bonding layer.

A second shielding layer is formed on the second surface of the wafer and in the cutting groove. The second shielding layer is electrically connected to the first metal bonding layer.

In the method for packaging the chip according to embodiments of the present disclosure, the passivation layer is provided on the bonding pads of the wafer, the first metal bonding layer is formed on the passivation layer, and the second metal bonding layer is formed on the substrate. The substrate and the wafer are bonded via the first metal bonding layer and the second metal bonding layer, and are packaged as a whole. The first shielding layer is provided on the substrate, and the first shielding layer is in contact with the second metal bonding layer. After the wafer and the substrate are bonded, the wafer is subject to half-cutting to expose the first metal bonding layer. Then, the second shielding layer electrically connected to the first metal bonding layer is formed. In one embodiment, formed is an electromagnetic shielding structure including the first shielding layer, the second metal bonding layer, the second shielding layer, and the first metal bonding layer. The shielding structure forms an approximately closed space, improving the electromagnetic shielding effect.

In addition, the passivation layer is provided between the bonding pads and the metal bonding layers, and the bonding pads serve as a conducting structure rather than a bonding structure. In one embodiment, a through-silicon via (TSV) not contacting the metal bonding layers can be provided on the bonding pads, and the functional circuit regions located between the wafer and the substrate is electrically introduced via the TSV to an outside of the chip packaging structure. That is, the TSV is disposed above the bonding pads, and it is not necessary to provide a copper pillar that occupies an area in the functional circuit regions. Hence, a spatial utilizing rate of the functional circuit region is increased. A volume of a chip is reduced without shrinkage of the functional circuit regions, ensuring a performance of the chip.

Hereinafter the embodiments of the present disclosure are described clearly and completely in conjunction with the drawings in embodiments of the present closure. Apparently, the described embodiments are only some rather than all of the embodiments of the present disclosure.

Reference is made to FIG. 1, which is a flow chart of a method for packaging a chip according to an embodiment of the present disclosure. The method for packaging the chip includes steps S101 to S107.

In step S101, a wafer is provided. The wafer includes a first surface and a second surface that are opposite to each other. At least two functional circuit regions and multiple bonding pads are formed on the first surface, and the multiple bonding pads are located around each of the at least two functional circuit regions;

A specific type of the chip is not limited in this embodiment of the present disclosure. A filter chip is taken as an example for description. The filter chip is designed based on a principle concerning surface acoustic waves or bulk acoustic waves. When the filter chip is packaged, an air cavity should be formed at a side of a resonant device to prevent a sound wave from dissipating or being conducted via a contacting medium. In one embodiment, it is ensured that the sound wave resonates in a desired mode and an output of the filter chip is at a desired frequency. That is, it is necessary to provide a cavity at the side of the resonant device when each filter chip is packaged.

Figure 2:
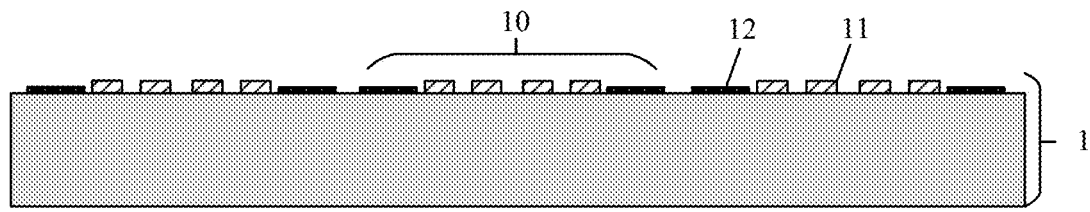
FIG. 2 to FIG. 17 are schematic diagrams of processes in a method for packaging a chip according to embodiments of the present disclosure.

Reference is made to FIG. 2, which is a structural diagram of a cross section of a wafer. The wafer includes a first surface and a second surface that are opposite. In FIG. 2, the first surface and the second surface are an upper surface and a lower surface, respectively, which are not indicated by reference numerals herein. Resonant circuits 11 and bonding pads 12 of filters are formed on the first surface of the wafer 1. Before the wafer is cut, filter devices 10 are generally arranged in an array on the wafer for batch processing.

Each filter device 10 includes a resonance circuit 11 and bonding pads 12.

In this embodiment, a functional circuit region corresponding to the filter chip is the resonant circuit. In other embodiments, the functional circuit region may have a circuit of a different structure, according to a different design of chip functions.

In step S102, a passivation layer is formed on each bonding pad. The passivation layer includes a center region and a peripheral region surrounding the center region.

Figure 3:
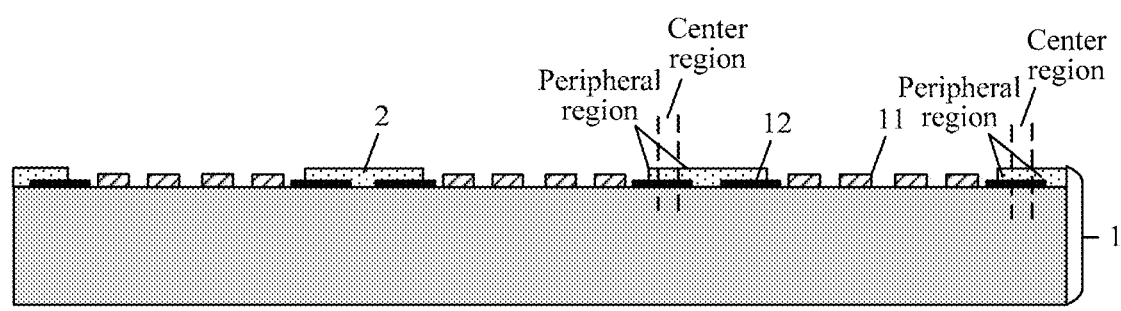

As shown in FIG. 3, the passivation layer 2 is formed on each bonding pad 12. A specific position of the passivation layer is not limited in this embodiment. In this embodiment, the passivation layer may be formed through deposition, namely, the passivation layer is deposited on a surface of the bonding pads. A material of the passivation layer may be one of silicon, amorphous AlN, $Si_3N_4$, or silicon oxide. In one embodiment, the passivation layer formed on bonding pads between two adjacent functional circuit regions may be an integral portion, so as to facilitate the deposition.

A specific thickness of the passivation layer is not limited in this embodiment, and different thicknesses may be set according to different chip structures to be formed. The filter chip is taken as an example. Since the resonant circuit of the filter chip needs to be disposed in the cavity, herein a height of the cavity may be controlled through setting the thickness of the passivation layer. In one embodiment, the thickness of the passivation layer ranges from 1 μm to 5 μm, endpoints included.

In step S103, a first metal bonding layer is formed on the passivation layer. The first metal bonding layer covers the peripheral region of the passivation layer.

In this embodiment, the first metal bonding layer covers the peripheral region of the passivation layer, to facilitate connection between the second metal bonding layer and the first shielding layer on the substrate when providing a corresponding second metal bonding layer in a subsequent step. In one embodiment, an approximately closed electromagnetic shielding structure can be obtained.

A specific method of forming the first metal bonding layer is not limited in this embodiment, as long as it is ensured that a surface of the substrate is attached to a surface of the passivation layer after bonding the first metal bonding layer with the second metal bonding layer in a subsequent step.

Figure 4:
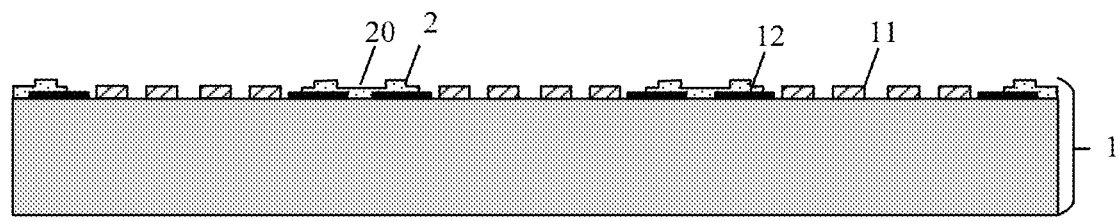

Reference is made to FIG. 4. In a specific embodiment, the first metal bonding layer may be formed on the passivation layer 2 in a following manner.

A first groove 20 is formed on the passivation layer 2. A position of the first groove is not limited herein, and may be determined according to a preset bonding location.

Figure 5:
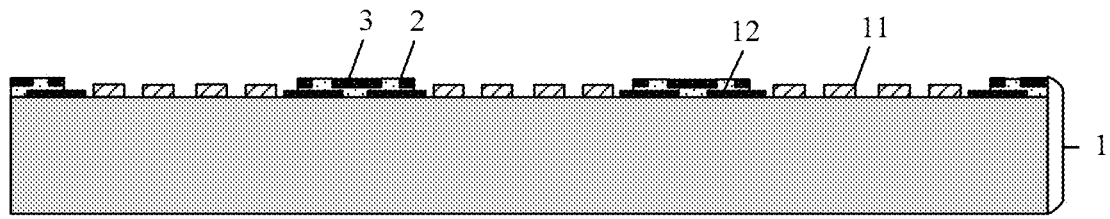

As shown in FIG. 5, the first groove 20 may be filled through a Damascene process to form the first metal bonding layer 3. A surface of the first metal bonding layer 3 away from the passivation layer 2 is flush with a surface of the passivation layer 2 away from the bonding pads 12. That is, as shown in FIG. 5, an upper surface of the first metal bonding layer 3 is flush with an upper surface of the passivation layer 2.

The Damascene process refers to filling a material of the first metal bonding layer into the first groove, so that the surface of the first metal bonding layer is flush with the surface of the passivation layer.

In order to strengthen the bonding between the first metal bonding layer and the second metal bonding layer, the method in this embodiment may further include a following step. The surface of the first metal bonding layer and the surface of the passivation layer are planarized, so that the surface of the first metal bonding layer is flush with the surface of the passivation layer.

In one embodiment, the first metal bonding layer may be formed through evaporation.

In order to ensure a passivating effect of the passivation layer, a bottom of the first groove should be located above the bonding pads, and the passivation layer should remain between the first metal bonding layer and the bonding pads. In one embodiment, a thickness of the first metal bonding layer ranges from 100 nm to 1000 nm, endpoints included.

In step S104, a substrate is provided. The substrate includes a third surface and a fourth surface that are opposite to each other. A second metal bonding layer and a first shielding layer are formed on the third surface, the second metal bonding layer is configured to be bonded with the first metal bonding layer, and the first shielding layer is configured to face the at least two functional circuit regions after the wafer and the substrate are bonded. The first shielding layer is in contact with the second metal bonding layer.

Herein providing the substrate includes following steps.

A base of the substrate is provided. The base of the substrate includes the third surface and the fourth surface that are opposite to each other.

Figure 6:
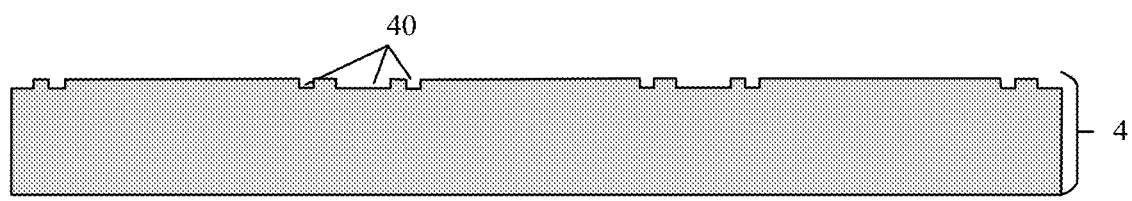

As shown in FIG. 6, a second groove 40 is formed on the third surface of the substrate 4.

Figure 7:
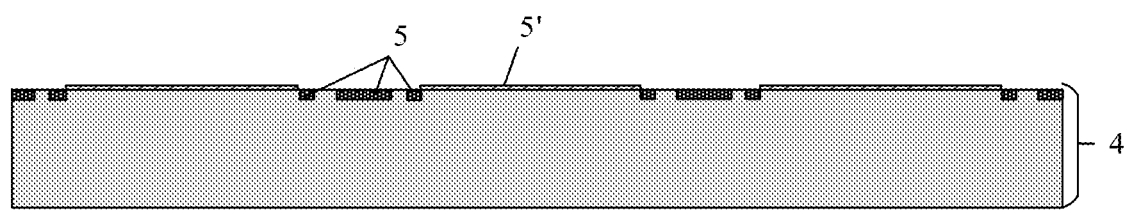

As shown in FIG. 7, the second groove 40 is filled through a Damascene process to form the second metal bonding layer 5. A surface of the second metal bonding layer 5 away from the substrate 4 is flush with the third surface. That is, as shown in FIG. 7, an upper surface of the second metal bonding layer 5 is flush with an upper surface of the substrate 4.

As shown in FIG. 7, a first shielding layer 5' is disposed at a position corresponding to the functional circuit regions. In this embodiment, a material of the first shielding layer is not limited, as long as being conductive and achieves an electromagnetic shielding effect. In one embodiment, the material of the first shielding layer may be metal, including copper, silver, nickel, or nickel-iron alloy.

In this embodiment, a position of the second metal bonding layer 5 is correspondingly determined according to a position of the first metal bonding layer 3.

In addition, the method may further include a following step, in order to ensure that the third surface of the substrate is attached to the surface of the passivation layer after the first metal bonding layer and the second metal bonding layer are bonded. The surface of the second metal bonding layer and a surface of the base of the substrate are planarized, so that the surface of the first metal bonding layer is flush with the surface of the base of the substrate.

When forming the cavity for the filter chip, the method may include a following step for controlling a height of the cavity, besides setting the thickness of the passivation layer. A third groove is formed on the third surface. The third groove is located at a position facing the functional circuit regions after the bonding.

The third groove is provided to fabricate a filter chip having a high cavity. A shape of the third groove is not limited in this embodiment. A cross section of the third groove perpendicular to the third surface may be rectangular or an arcuate, which is not limited herein.

In step S105, the first metal bonding layer is bonded with the second metal bonding layer. At least a part of the center region is not covered by the second metal bonding layer, and the third surface is attached to a surface of the passivation layer away from the wafer.

Figure 8:
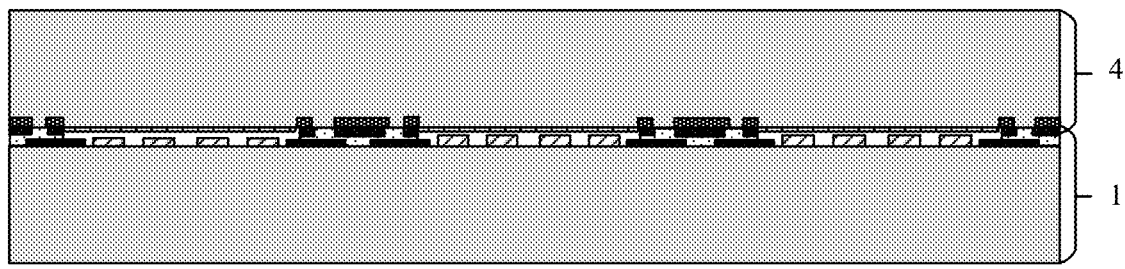

As shown in FIG. 8, the first metal bonding layer and the second metal bonding layer are bonded, and the surface of the passivation layer is closely attached to the surface of the substrate. A part of the center region of the passivation layer is not blocked by the second metal bonding layer, facilitating forming a TSV in a subsequent step.

Materials of the first metal bonding layer and the second metal bonding layer are not limited herein. In one embodiment, materials of the first metal bonding layer and the second metal bonding layer are same, and both are metallic. Herein the metal materials are used to form metallic bonding, which is more stable than a bonding structure formed via bonding glue. Hence, the chip packaging structure is highly reliable. In one embodiment, the material of the first metal bonding layer includes copper, gold, or copper-tin alloy.

In embodiments of the present disclosure, projection areas of the first metal bonding layer and the second metal bonding layer on the wafer are not limited, and specific positions of the first metal bonding layer and the second metal bonding layer are not limited, as long as the wafer and the substrate are bounded and the second metal bonding layer is in electrical contact with the first shielding layer. In one embodiment, it is facilitated that an approximately closed shielding structure is formed in a subsequent step while ensuring reliability of the chip.

In step S106, half-cutting is performed from the second surface of the wafer towards the substrate, to form a cutting groove exposing at least the first metal bonding layer.

Figure 9:
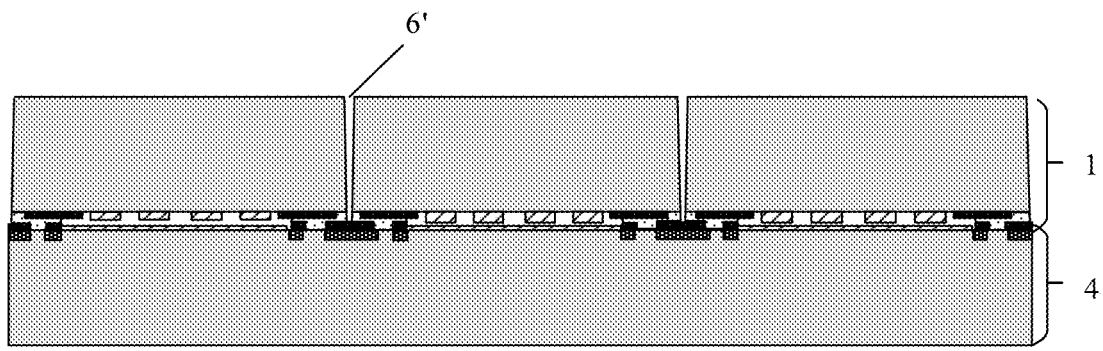

Reference is made to FIG. 9, in which the half-cutting is performed from the second surface of the wafer 1 towards the substrate to obtain the cutting groove 6'.

In step S107, a second shielding layer is formed on the second surface of the wafer and in the cutting groove. The second shielding layer is electrically connected to the first metal bonding layer.

Figure 10:
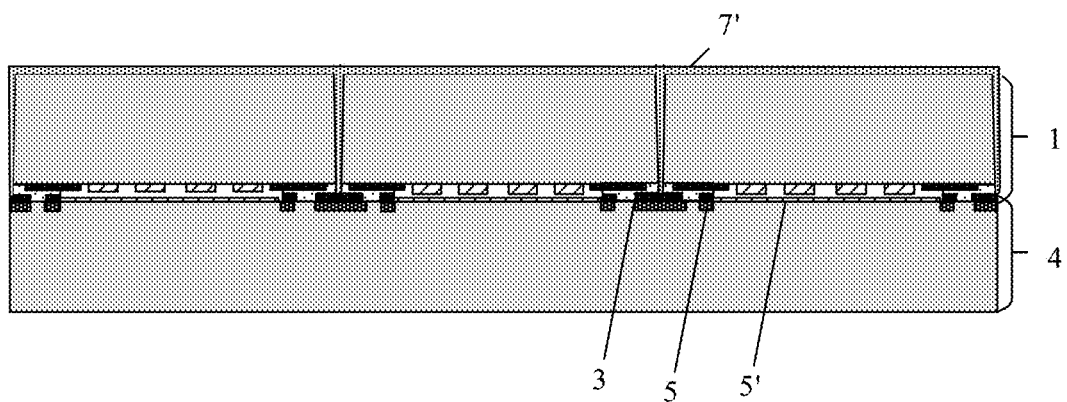

As shown in FIG. 10, the first metal bonding layer is exposed after the half-cutting, and the second shielding layer 7' is formed on the second surface of the wafer and in the cutting groove. In one embodiment, the second shielding layer is electrically connected to the first metal bonding layer, and thus serves as a part of the electromagnetic shielding structure.

The first metal bonding layer 3 and the second metal bonding layer 5 are bonded with each other, and the first shielding layer 5', the second metal bonding layer 5, the first metal bonding layer 3, and the second shielding layer 7' form the electromagnetic shielding structure that is approximately closed.

After the step S107, a semi-manufactured chip structure is formed through the method according to embodiments of the present disclosure.

Moreover, the method may include a step of forming a TSV, to introduce an internal signal of the circuit to the outside. Herein the step of forming the TSV may be performed before the half-cutting or after the half-cutting.

Figure 11:
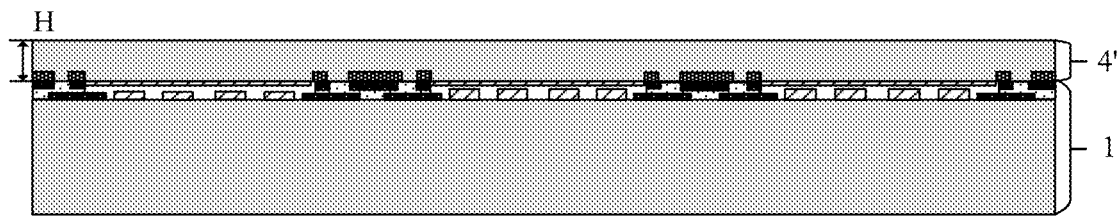
Figure 12:
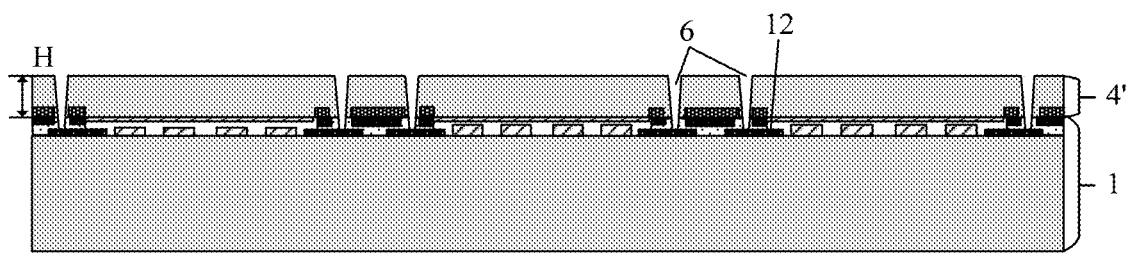
Figure 13:
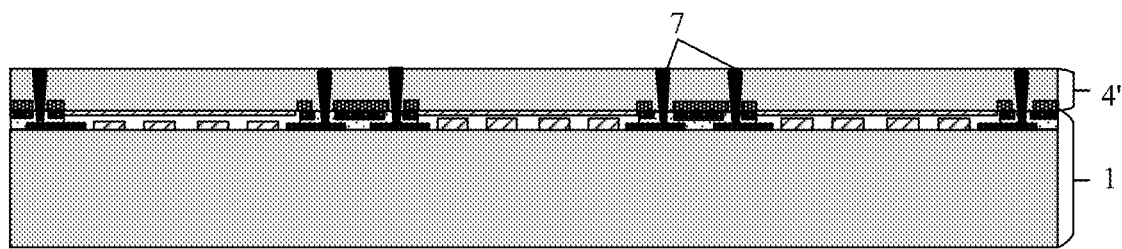

As shown in FIGS. 11 to 13, the TSV is formed before the half-cutting, which includes following steps.

Reference is made to FIG. 11. The substrate is thinned from the fourth substrate.

The substrate is thinned to facilitate forming an opening in a subsequent step.

Hence, a thickness of the thinned substrate 4' aims to meet a requirement on forming the opening. In this embodiment, a specific thickness of the thinned substrate is not limited. In one embodiment, the thickness H of the thinned substrate ranges from 30 µm to 100 µm, endpoints included, in order to facilitate forming the opening subsequently and meet a requirement on reliability of the chip.

Reference is made to FIG. 12. The substrate and the center region of the passivation layer are etched to form the opening, and the opening runs through at least the substrate and the passivation layer to expose the bonding pad(s).

Reference is made to FIG. 13. The opening is filled to form an electrically conductive structure 7.

Forming the TSV before the half-cutting may bring a difficulty in avoiding cracking of the wafer. Alternatively, the half-cutting in this embodiment may be performed before the TSV opening.

Figure 14:
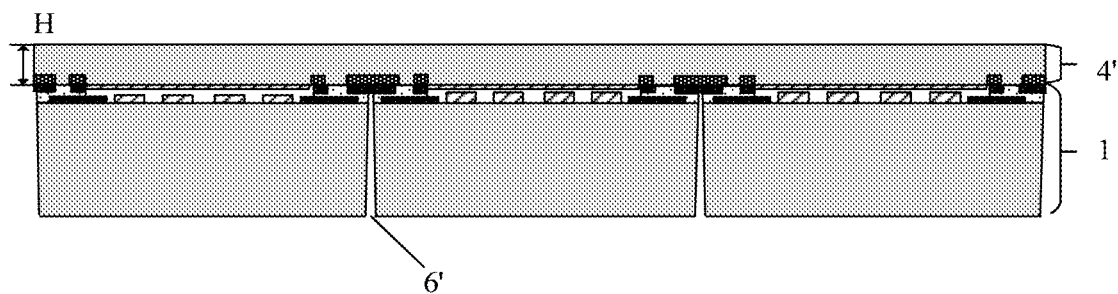
Figure 15:
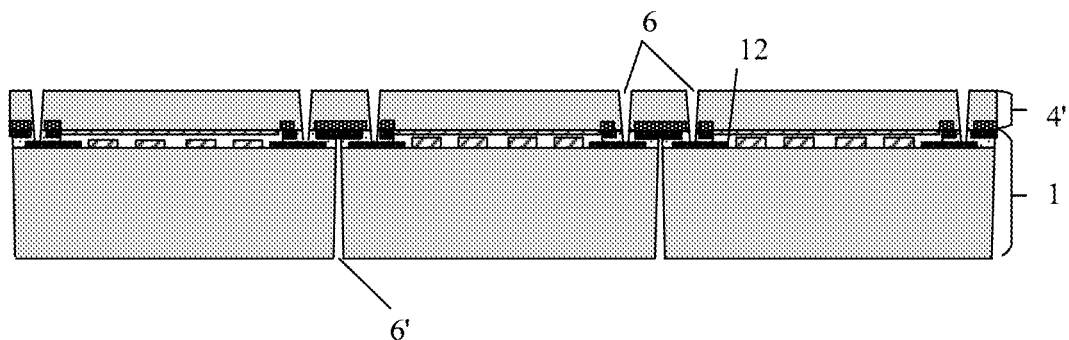
Figure 16:
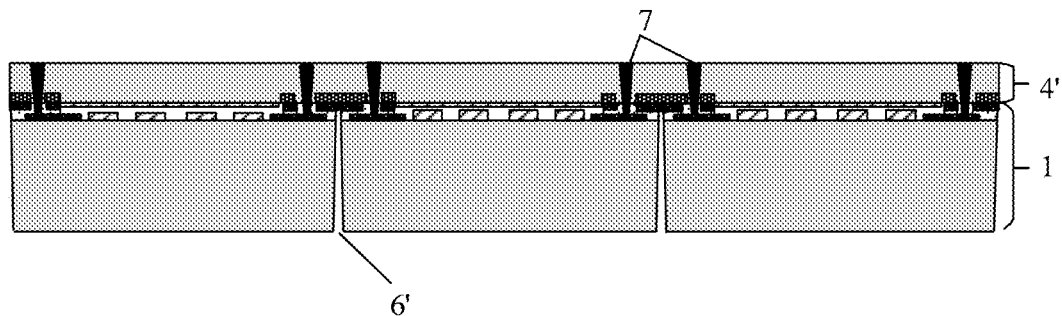

As shown in FIGS. 14 to 16, the TSV is formed after the half-cutting, which includes following steps.

Reference is made to FIG. 14. The substrate is thinned from the fourth surface.

The substrate is thinned to facilitate forming an opening in a subsequent step. Hence, a thickness of the thinned substrate 4' aims to meet a requirement on forming the opening. In this embodiment, a specific thickness of the thinned substrate is not limited. In one embodiment, the thickness H of the thinned substrate ranges from 30 µm to 100 µm, endpoints included, in order to facilitate forming the opening subsequently and meet a requirement on reliability of the chip.

Reference is made to FIG. 15. The substrate and the center region of the passivation layer are etched to form the opening, and the opening runs through at least the substrate and the passivation layer to expose the bonding pad(s).

Reference is made to FIG. 16. The opening is filled to form an electrically conductive structure 7.

As shown in FIG. 12 and FIG. 15, the substrate is etched from a surface on which the thinning is performed. The base of the substrate and the passivation layer is subsequently etched to obtain the opening 6 that exposes the bonding pad 12.

Herein the opening may run through mere the substrate and the passivation layer without exposing the first metal bonding layer or the second metal bonding layer. Alternatively, only the first metal bonding layer or only the second metal bonding layer may be exposed at a sidewall of the opening, or both the first metal bonding layer and the second metal bonding layer may be exposed at a sidewall of the opening. The present disclosure is not limited to the above cases.

The etching is performed from a surface of the thinned substrate away from the third surface. The substrate, the second metal bonding layer, and the passivation layer are sequentially etched, to expose the bonding pad(s) and form the opening.

Figure 17:
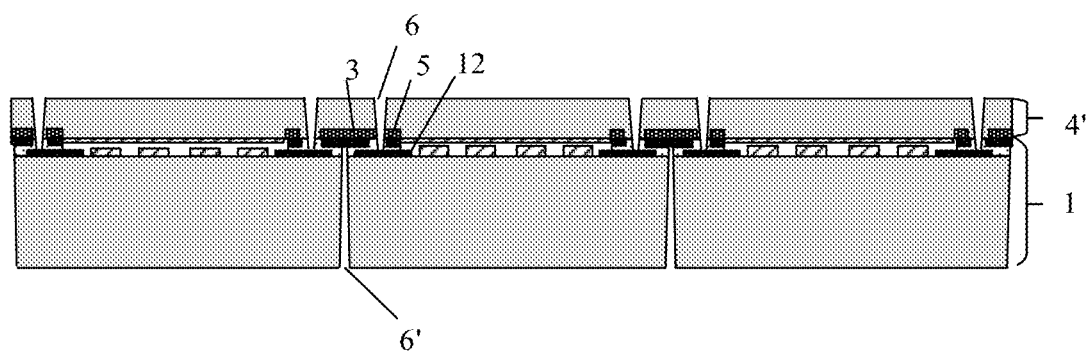

In another embodiment, it may be required to lead out and ground an internal structure of the circuit. In such case, as shown in FIG. 17, the etching is performed from a surface of the thinned substrate 4' away from the third surface. The substrate 4', the second metal bonding layer 5, the first metal bonding layer 3, and the passivation layer 2 are sequentially etched to expose the bonding pad(s) and form the opening. That is, after the opening is filled subsequently, the metal in the opening is electrically connected to the metal of the first metal bonding layer and the second metal bonding layer, achieving grounding.

Alternatively, when forming the opening, only the substrate, the second metal bonding layer, and the passivation layer are etched through. Alternatively, when forming the opening, only the substrate, the first metal bonding layer, and the passivation layer are etched through. This embodiment is not limited thereto, as long as the metal bonding layer may serve as a grounding ring when the grounding is needed. In such case, a space occupied by the chip is further reduced.

After the opening is filled with a conductive material to form the conductive structure 7, the bonding pad(s) on the wafer are electrically led out. Herein, after the opening is filled to form the conductive structure, the method further includes a step of placing a solder ball on a surface of the conductive structure. The solder ball is electrically connected to the conductive structure, and the formed chip structure can be electrically connected to another component directly.

Finally, cutting is performed from at a surface away from the cutting groove, which is obtained through the half-cutting, so as to form multiple chip packaging structures.

Figure 18:
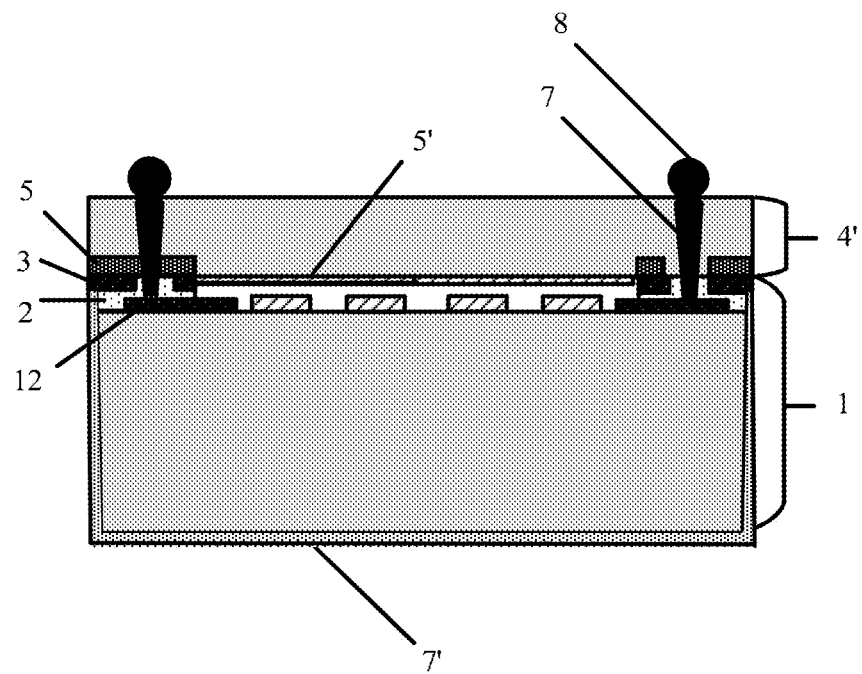
FIG. 18 is a schematic structural diagram of a chip packaging structure according to an embodiment of the present disclosure.

Multiple individual chip packaging structures are obtained through cutting the wafer, as shown in FIG. 18, which is a schematic structural diagram of a chip packaging structure according to an embodiment of the present disclosure. In FIG. 18, at the left electrical connection, the opening runs through the second metal bonding layer 5, and the conductive structure 7 is electrically connected to the second metal bonding layer 5. In one embodiment, the internal circuit is led out for grounding. In another embodiment as shown in FIG. 17, the opening runs through not only the second metal bonding layer 5 but also the first metal bonding layer 3, so as to lead the internal circuit out for grounding.

In the method for packaging the chip according to embodiments of the present disclosure, the passivation layer is provided on the bonding pads of the wafer, the first metal bonding layer is formed on the passivation layer, and the second metal bonding layer is formed on the substrate. The substrate and the wafer are bonded via the first metal bonding layer and the second metal bonding layer, and are packaged as a whole. The first shielding layer is provided on the substrate, and the first shielding layer is in contact with the second metal bonding layer. After the wafer and the substrate are bonded, the wafer is subject to half-cutting to expose the first metal bonding layer. Then, the second shielding layer electrically connected to the first metal bonding layer is formed. In one embodiment, formed is an electromagnetic shielding structure including the first shielding layer, the second metal bonding layer, the second shielding layer, and the first metal bonding layer. The shielding structure forms an approximately closed space, improving the electromagnetic shielding effect.

On a basis of similar concepts, a chip packaging structure is further provided according to embodiments of the present disclosure. The chip packaging structure is fabricated through the foregoing method. Reference is made to FIG. 18. The chip packaging structure includes a wafer 1, a substrate 4', functional circuit regions, a bonding pad 12, a passivation layer 2, a first metal bonding layer 3, a second metal bonding layer 5, a conductive structure 7, a first shielding layer 5', and a second shielding layer 7'.

The wafer 1 and the substrate 4' are opposite to each other.

The functional circuit region and bonding pad 12 are located on a surface of the wafer 1 facing the substrate 4'. The bonding pad is located around the functional circuit region.

The passivation layer 2 is located on the bonding pad 12, and is attached to a surface of the substrate 4'.

The first metal bonding layer 3 is located on a surface of the passivation layer 2 away from the wafer 1.

The second metal bonding layer 5 is located on a surface of the substrate 4' facing the wafer 1. A bonding interface is formed between the first metal bonding layer 3 and the second metal bonding layer 5.

The conductive structure 7 is located in the substrate 4'. The conductive structure 7 runs through at least the substrate 4' and the passivation layer 2, and is electrically connected to the bonding pad 12.

The first shielding layer 5' covers the surface of the substrate 4' facing the wafer 1, and is electrically connected to the second metal bonding layer 5.

The second shielding layer 7' covers surfaces of the wafer 1 other than the surface facing the substrate 4', and covers a sidewall of the passivation layer 2.

Herein the chip packaging structure may further include a solder ball 8 located on the conductive structure 7, so as to facilitate direct subsequent utilization of the chip.

Parameters and materials of each structure are not limited herein. Optional embodiments may be as follows. A material of the first shielding layer and a material of the second shielding layer are same, and both are metallic. The material of the first shielding layer includes copper, silver, nickel, or nickel-iron alloy. A thickness of the first metal bonding layer ranges from 100 nm to 1000 nm, endpoints included. A thickness of the passivation layer ranges from 1 µm to 5 µm, endpoints included. A material of the passivation layer includes silicon, amorphous AlN, $Si_3N_4$, or silicon oxide. A material of the first metal bonding layer and a material of the second metal bonding layer are same, and both are metallic. The material of the first metal bonding layer includes copper, gold, or copper-tin alloy. A thickness of the second metal bonding layer ranges from 1 µm to 5 µm, including endpoint. A thickness of the substrate ranges from 30 µm to 100 µm, endpoints included.

Figure 19:
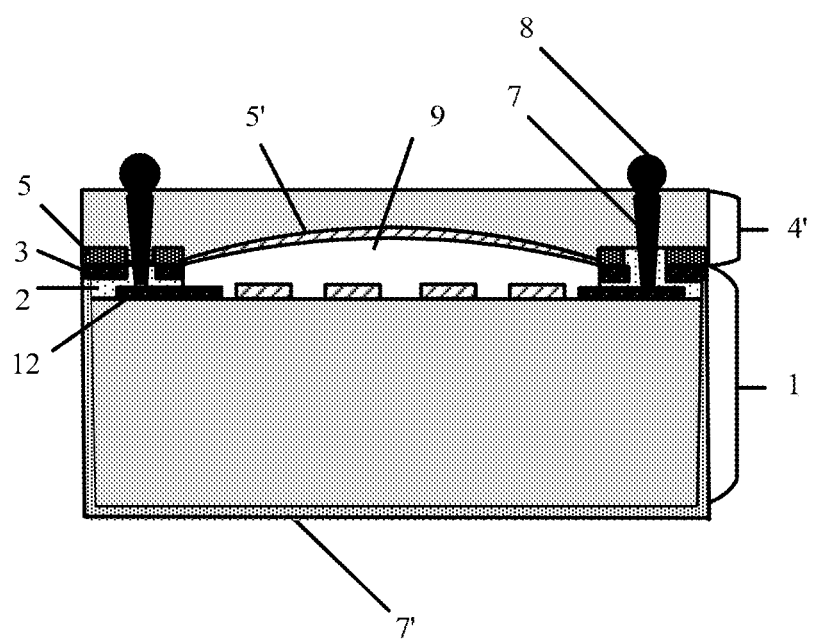
FIG. 19 is a schematic structural diagram of another chip packaging structure according to an embodiment of the present disclosure.

In a case that the chip structure is a filter chip, a groove 9 is provided in a region on the surface of the substrate facing the wafer, and the region faces the functional circuit region. As shown in FIG. 19, the groove corresponding to the resonant circuit is provided in the substrate. The groove may be arcuate or rectangular, which is not limited herein. As an example, an arcuate groove is shown in FIG. 19.

Figure 20:
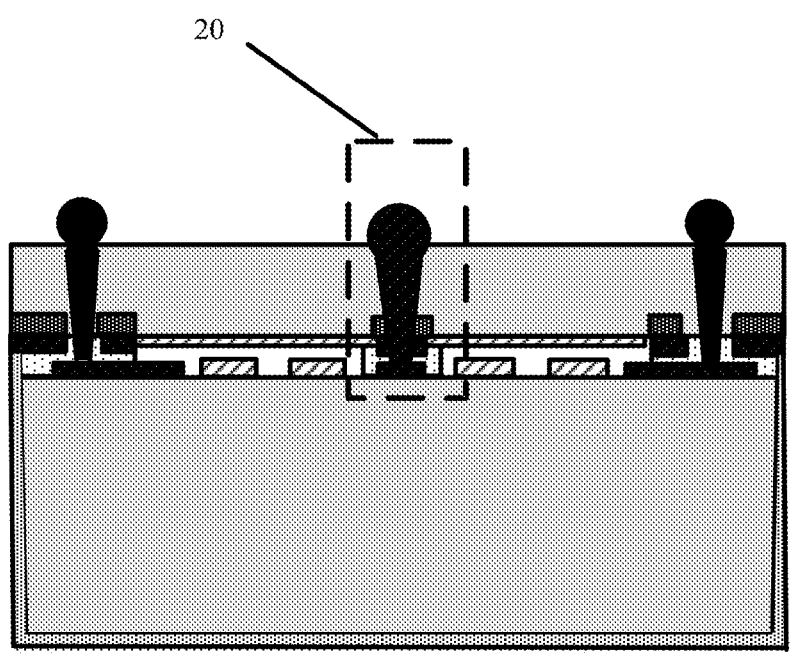
FIG. 20 is a schematic structural diagram of another chip packaging structure according to an embodiment of the present disclosure.

In addition, in a case that a signal within the resonant circuit needs to be introduced to an outside of the chip, another TSV may be further provided in an intermediate region of the chip. A structural arrangement thereof is similar to that in the bonding region (i.e. where the first metal bonding layer, the second metal bonding layer, and the aforementioned TSV are located). As shown in FIG. 20 and indicated by reference numeral 20, another bonding structure includes a bonding pad on the wafer, a passivation layer on the bonding pad, a first metal bonding layer and a second metal bonding layer that are located on the passivation layer, and a TSV that runs through the substrate, the second metal bonding layer, the first metal bonding layer, and the passivation layer sequentially and to expose the bonding pad.

Various chip packaging structures can be further provide based on the concepts of the present disclosure, and are not described in detail herein.

In addition, the method according to embodiments of the present disclosure may be applied to simultaneous packaging of a wafer having multiple filters, and obtain a packaging structure of multiple filters. Such structure includes multiple-in-one products such as double filters, triple filters, quadruple filters, as well as multiplexer products such as duplexers, quadruplexers, hexaplexers, and octaplexers. In one embodiment, a smallest structure and a best performance of the product are directly achieved.

The chip packaging structure provided according to embodiments of the present disclosure is suitable for packaging all types of filters (all types of SAW and BAW), since the method for packaging the chip in the forgoing embodiments is applied with compatibility of existing processes, existing equipment, and common materials. Further, the chip packaging structure is suitable for packaging both single and multiple filters. Moreover, the chip packaging structure is also suitable for packaging a front-end RF device (SIP devices) including a filter required by a cellular terminal. The cellular terminals include terminal devices such as 2G/3G/4G/5G mobile phones, WiFi devices, Pads, smart watches, over the top (JOT) devices, vehicle-mounted devices.

The chip packaging structure according to embodiments of the present disclosure is obtained through the method for packaging the chip in the foregoing embodiments. The passivation layer is provided on the bonding pads of the wafer, the first metal bonding layer is formed on the passivation layer, and the second metal bonding layer is formed on the substrate. The substrate and the wafer are bonded via the first metal bonding layer and the second metal bonding layer, and are packaged as a whole. The first shielding layer is provided on the substrate, and the first shielding layer is in contact with the second metal bonding layer. After the wafer and the substrate are bonded, the wafer is subject to half-cutting to expose the first metal bonding layer. Then, the second shielding layer electrically connected to the first metal bonding layer is formed. In one embodiment, formed is an electromagnetic shielding structure including the first shielding layer, the second metal bonding layer, the second shielding layer, and the first metal bonding layer. The shielding structure forms an approximately closed space, improving the electromagnetic shielding effect.

In addition, the passivation layer is provided between the bonding pads and the metal bonding layers, and the bonding pads serve as a conducting structure rather than a bonding structure. In one embodiment, the TSV not contacting the metal bonding layers can be provided on the bonding pads, and the functional circuit regions located between the wafer and the substrate is electrically introduced via the TSV to an outside of the chip packaging structure. That is, the TSV is disposed above the bonding pads, and it is not necessary to provide a copper pillar that occupies an area in the functional circuit regions. Hence, a spatial utilizing rate of the functional circuit region is increased. A volume of the chip is reduced without shrinkage of the functional circuit regions, ensuring a performance of the chip.

The embodiments of the present disclosure are described in a progressive manner, and each embodiment places emphasis on the difference from other embodiments. Therefore, one embodiment can refer to other embodiments for the same or similar parts.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . ." does not exclude the case that other similar elements may exist in the process, the method, the article or the device other than enumerated elements.

The invention claimed is:

1. A method for packaging a chip, comprising:
    providing a wafer, wherein the wafer comprises a first surface and a second surface that are opposite to each other, at least two functional circuit regions and a plurality of bonding pads are formed on the first surface, and the plurality of bonding pads are located around each of the at least two functional circuit regions;
    forming a passivation layer on each of the plurality of bonding pads, wherein the passivation layer comprises a center region and a peripheral region surrounding the center region;
    forming a first metal bonding layer on the passivation layer, wherein the first metal bonding layer covers the peripheral region of the passivation layer;
    providing a substrate, wherein the substrate comprises a third surface and a fourth surface that are opposite to each other, a second metal bonding layer and a first shielding layer are formed on the third surface, the second metal bonding layer is configured to be bonded with the first metal bonding layer, the first shielding layer is configured to face the at least two functional circuit regions after the wafer and the substrate are bonded, and the first shielding layer is in contact with the second metal bonding layer;
    bonding the first metal bonding layer with the second metal bonding layer, wherein at least a part of the center region is not covered by the second metal bonding layer, and the third surface is attached to a surface of the passivation layer away from the wafer after the bonding;
    performing half-cutting from the second surface of the wafer toward the substrate, to form a cutting groove exposing at least the first metal bonding layer; and
    forming a second shielding layer on the second surface of the wafer and in the cutting groove, wherein the second shielding layer is electrically connected to the first metal bonding layer.

2. The method according to claim 1, wherein after bonding the first metal bonding layer with the second metal bonding layer and before performing the half-cutting from the second surface of the wafer towards the substrate, or after performing the half-cutting from the second surface of the wafer towards the substrate, the method further comprises:
    thinning the substrate from the fourth surface;
    etching the substrate and the center region of the passivation layer to form an opening, wherein the opening runs through at least the substrate and the passivation layer to expose one of the plurality of bonding pads; and
    filling the opening to form a conductive structure.

3. The method according to claim 2, wherein etching the substrate and the center region to form the opening comprises:
    etching the thinned substrate, the second metal bonding layer, and the passivation layer sequentially, from a surface of the thinned substrate away from the third surface, to expose the bonding pad and form the opening.

4. The method according to claim 2, wherein after filling the opening to form the conductive structure, the method further comprises:
    placing a solder ball on a surface of the conductive structure.

5. The method according to claim 1, wherein forming the first metal bonding layer on the passivation layer comprises:
    forming a first groove on the passivation layer; and
    filling the first groove through a Damascene process to form the first metal bonding layer, wherein a surface of the first metal bonding layer away from the passivation layer is flush with a surface of the passivation layer away from the multiple bonding pads.

6. The method according to claim 5, wherein forming the first metal bonding layer, the method further comprises:
    planarizing the surface of the first metal bonding layer and the surface of the passivation layer, where the surface of the first metal bonding layer is flush with the surface of the passivation layer after the planarizing.

7. The method according to claim 1, wherein providing the substrate comprises:
    providing a base of the substrate, wherein the base of the substrate comprises the third surface and the fourth surface that are opposite to each other;
    forming a second groove on the third surface;
    filling the second groove through a Damascene process to form the second metal bonding layer, wherein a surface of the second metal bonding layer away from the substrate is flush with the third surface; and
    forming the first shielding layer.

8. The method according to claim 7, wherein after forming the second metal bonding layer, the method further comprises:
    planarizing the surface of the second metal bonding layer and a surface of the base of the substrate, wherein the surface of the second metal bonding layer is flush with the surface of the base of the substrate after the planarizing.

9. The method according to claim 7, wherein before forming the first shielding layer, the method further comprises:
forming a third groove on the third surface, wherein the third groove is located at a position facing the at least two functional circuit regions after bonding the wafer and the substrate.

10. The method according to claim 1, wherein a material of the first shielding layer is metallic, and is same as a material of the second shielding layer.

11. The method according to claim 1, wherein a material of the first metal bonding layer is metallic, and is same as a material of the second metal bonding layer.

12. A chip packaging structure, manufactured through the method according to claim 1, comprising:
the wafer and the substrate that are opposite to each other;
a functional circuit region, which is of the at least two functional circuit regions, and a bonding pad, which is of the plurality of bonding pads, that are located on a surface of the wafer facing the substrate, wherein the bonding pad is located around the functional circuit region;
the passivation layer, located on the bonding pad and attached to a surface of the substrate;
the first metal bonding layer located on a surface of the passivation layer away from the wafer;
the second metal bonding layer located on a surface of the substrate facing the wafer, wherein a bonding interface is formed between the first metal bonding layer and the second metal bonding layer;
a conductive structure located in the substrate, wherein the conductive structure runs through at least the substrate and the passivation layer, and is electrically connected to the bonding pad;
the first shielding layer, covering a surface of the substrate facing the wafer, wherein the first shielding layer is electrically connected to the second metal bonding layer; and
the second shielding layer, covering surfaces of the wafer other than the surface facing the substrate, and covering a sidewall of the passivation layer.

13. The chip packaging structure according to claim 12, further comprising a solder ball located on the conductive structure.

14. The chip packaging structure according to claim 12, wherein a material of the first shielding layer is metallic, and is same as a material of the second shielding layer.

15. The chip packaging structure according to claim 14, wherein the material of the first shielding layer includes copper, silver, nickel, or nickel-iron alloy.

16. The chip packaging structure according to claim 12, wherein a material of the first metal bonding layer is metallic, and is same as a material of the second metal bonding layer.

17. The chip packaging structure according to claim 16, wherein the material of the first metal bonding layer includes copper, gold, or copper-tin alloy.

18. The chip packaging structure according to claim 12, wherein a material of the passivation layer includes silicon, amorphous AlN, $Si_3N_4$, or silicon oxide.

19. The chip packaging structure according to claim 12, wherein a groove is provided in a region on the surface of the substrate facing the wafer, wherein the region faces the functional circuit region.

20. The chip packaging structure according to claim 12, wherein the chip packaging structure is a chip comprising a filter, and the functional circuit region corresponding to the filter is a resonance circuit.

* * * * *